(12) United States Patent
Hsu et al.

(10) Patent No.: US 7,242,998 B2
(45) Date of Patent: Jul. 10, 2007

(54) ETCHING OPERATION MANAGEMENT SYSTEMS AND METHODS

(75) Inventors: Yen-Pu Hsu, Jhongli (TW); Wei Cheng Hsien, Nantou (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 136 days.

(21) Appl. No.: 11/073,979

(22) Filed: Mar. 7, 2005

(65) Prior Publication Data

US 2006/0200265 A1 Sep. 7, 2006

(51) Int. Cl.
*G06F 19/00* (2006.01)
*G06F 7/00* (2006.01)

(52) U.S. Cl. .................. 700/121; 700/97; 700/95; 438/14

(58) Field of Classification Search ............... 700/121, 700/108, 109, 110; 438/14, 5, 17; 216/2
See application file for complete search history.

(56) References Cited

U.S. PATENT DOCUMENTS

| | | | | |
|---|---|---|---|---|
| 5,926,690 | A * | 7/1999 | Toprac et al. ............ | 438/17 |
| 6,368,879 | B1 * | 4/2002 | Toprac .................... | 438/5 |
| 2004/0029299 | A1 * | 2/2004 | Pasadyn et al. .......... | 438/5 |
| 2004/0138773 | A1 * | 7/2004 | Tomoyasu ............... | 700/108 |
| 2005/0136560 | A1 * | 6/2005 | Helwig ................... | 438/14 |

* cited by examiner

*Primary Examiner*—Kidest Bahta
*Assistant Examiner*—Nate Laughlin
(74) *Attorney, Agent, or Firm*—Thomas, Kayden, Horstemeyer & Risley

(57) ABSTRACT

Systems and methods for etching operation management. A process controller acquires a line width on a processed wafer, determines a first Critical Dimension (CD) bias by subtracting the measured width from a target width, determines an adjusted target width by providing a first and a second etching duration, determines a second CD bias by providing the adjusted target width, determines third etching duration corresponding to the second CD bias, receives an event from an etching tool, and directs the etching tool to perform etching operations on an initiated wafer for the third etching duration.

17 Claims, 7 Drawing Sheets

ETCHING OPERATION MANAGEMENT SYSTEMS AND METHODS

BACKGROUND

The invention relates to semiconductor device fabrication, and more particularly, to systems and methods of etching operation management.

Generally, a set of processing steps is performed across a group of semiconductor wafers, typically referred to as a lot. For example, a process layer that may be composed of a variety of different materials may be formed across a semiconductor wafer. Thereafter, a patterned layer of photoresist may be formed across the process layer using known photolithography techniques. Typically, an etching process is then performed across the process layer using the patterned layer of photoresist as a mask. The etching process results in the formation of various electronic devices in the process layer. Such electronic devices may be used as, for example, a gate electrode structure for transistors. Many durations, trench isolation structures are also formed across the substrate of the semiconductor wafer to isolate electrical areas across a semiconductor wafer. One example of an isolation structure that can be used is a shallow trench isolation (STI) structure. Critical dimensions (CDs), which are the geometries and spacings used to monitor the pattern size and ensure that it is within the customer specification, are especially to have size maintenance during processing. CD bias refers to a situation wherein the designed and actual values do not match. Ideally, CD bias approaches zero, but in actuality can measurably affect the resulting semiconductor device performance and operation.

CD control management is a major challenge in etching processes. Advanced process control (APC) feed-forward or feedback control systems have been widely deployed for after-etch inspection (AEI) and after-development inspection (ADI), as automated methods for monitoring and verifying CD. The APC feed-forward or feedback control systems initiate control scripts, which can be a software program that automatically retrieve the data needed to execute an etch process. For example, large amounts of analysis and/or computations are performed to adjust etching duration on wafers.

In conventional systems, an etching duration is only adjustable by given increments, such as 1, 2 or 3 second increments, resulting in inaccurate adjustment. FIG. 1 is a schematic diagram showing the conventional adjustment for etching duration. If the CD bias is detected as 24.9 nanometers, in an ideal case, the etching duration should be adjusted to approximately 33 seconds. The etching duration, however, can only be adjusted to 32 seconds when using conventional methods.

SUMMARY

Systems for etching operation management are provided. An exemplary embodiment comprises a metrology tool, an etching tool and a process controller. The process controller connects to the etching tool and the metrology tool. The process controller acquires a line width on a processed wafer measured by the metrology tool, determines a first Critical Dimension (CD) bias by subtracting the measured width from a target width, determines a first etching duration, determines a second etching duration, determines an adjusted target width based on the first and second etching durations, determines a second CD bias corresponding to the adjusted target width, determines a third etching duration corresponding to the second CD bias, and directing the etching tool to perform an etching operation on another wafer for the third etching duration.

Etching operation management methods are also provided. An exemplary method acquires a line width on a processed wafer, determines a first Critical Dimension (CD) bias by subtracting the measured width from a target width, determines a first etching duration corresponding to the first CD bias according to at least one mapping rule, determines a second etching duration corresponding to the first CD bias according to an etching equation, determines an adjusted target width based on the first and second etching durations, determines a second CD bias corresponding to the adjusted target width and determines a third etching duration corresponding to the second CD bias according to the mapping rule. Fabrication of at least one electronic device on which an etching operation has been performed utilizes the disclosed method.

Preferably, the mapping rule uses a given time increment to determine the first etching duration corresponding to the first CD bias and to determine the third etching duration corresponding to the second CD bias. The second etching duration may be an optimum etching duration corresponding to the first CD bias. The adjusted target width may be calculated by an equation:

$$W_{at} = W_t - R*(T_i - T_o),$$

where $W_{at}$ represents the adjusted target width, $W_t$ represents the target width, R represents the etching rate, $T_i$ represents the second etching duration, and $T_o$ represents the first etching duration. The etching rate represents the change in etching duration per one nanometer change in CD bias. The adjusted target width may be calculated by an equation, $$CD_b = W_p + W_c + W_m - W_{at},$$

where $CD_b$ represents the second CD bias, Wp represents the compensating width for the semiconductor product on the processed wafer, $W_c$ represents the compensating width for the chamber that the processed wafer was transited, $W_m$ represents the measured width, and $W_{at}$ represents the adjusted target width.

DESCRIPTION OF THE DRAWINGS

Etching operation management systems and methods will become apparent by referring to the following detailed description with reference to the accompanying drawings, wherein.

DESCRIPTION

Systems and methods of etching operation management are provided. An exemplary embodiment of etching operation management adjusts etching duration for a wafer having the same semiconductor product and in transit to the same chamber as a processed wafer. The etching duration adjustment may increase or decrease etching duration for the next wafer. A line width is measured using an electron beam (e-beam). The e-beam measurement may also be CD scanning electron microscope (CD-SEM) measurement.

Figure 2:
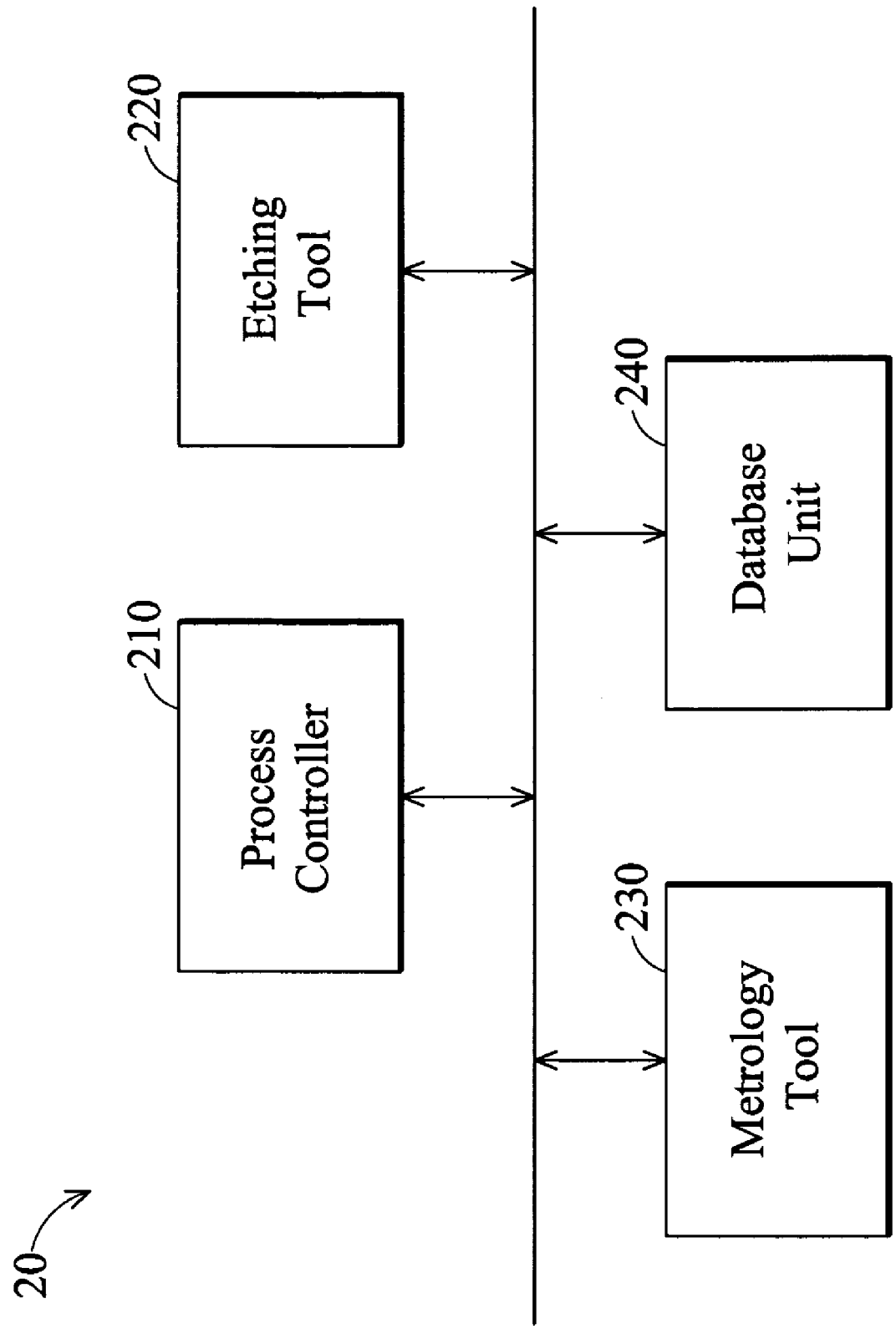
FIG. 2 is a diagram of an embodiment of an etching operation management system.

FIG. 2 is a diagram of an embodiment of etching operation management system 20, comprising a process controller 210, an etching tool 220, a metrology tool 230 and a database unit 240, operating in a network using logical connections. Those skilled in the art will recognize that the process controller 210, etching tool 220, metrology tool 230 and database unit 240 may be connected in different types of networking environments, and communicate between different types of networking environments through various types of transmission devices such as routers, gateways, access points, base station systems or others. Those skilled in the art will also recognize that the database unit 240 may be integrated in the metrology tool 230.

Figure 3:
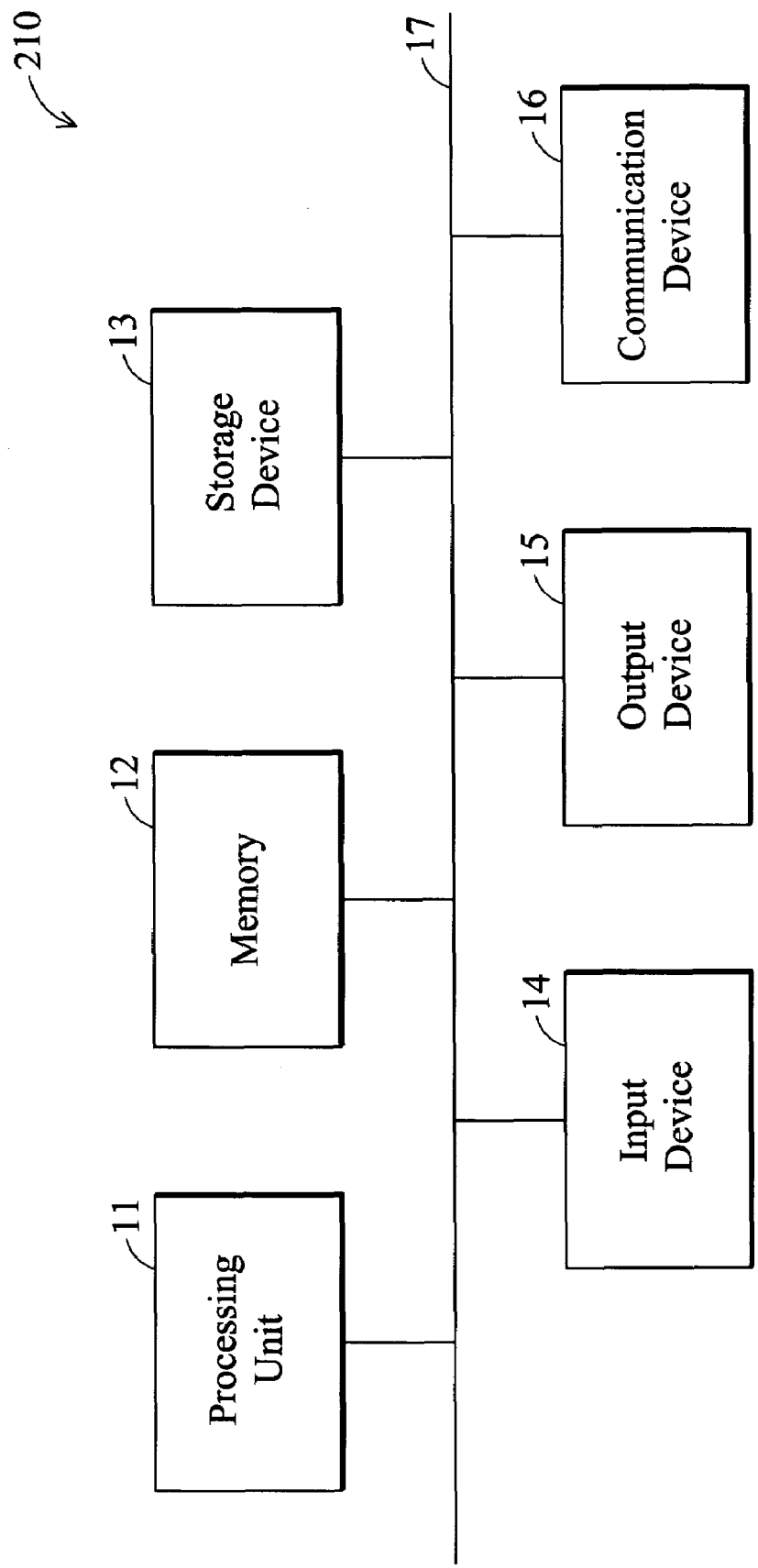
FIG. 3 is a diagram of a hardware environment applicable to a process controller in an embodiment of etching operation management system.

FIG. 3 is a diagram of a hardware environment applicable to the process controller 210 in an embodiment of an etching operation management system. The hardware environment of FIG. 3 includes a processing unit 11, a memory 12, a storage device 13, an input device 14, an output device 15 and a communication device 16. The processing unit 11 is connected by buses 17 to the memory 12, storage device 13, input device 14, output device 15 and communication device 16 based on Von Neumann architecture. There may be one or more processing units 11, such that the processor of the computer comprises a single central processing unit (CPU), a micro processing unit (MPU) or multiple processing units, commonly referred to as a parallel processing environment. The memory 12 is preferably a random access memory (RAM), but may also include read-only memory (ROM) or flash ROM. The memory 12 preferably stores program modules executed by the processing unit 11 to perform Web link management functions. Generally, program modules include routines, programs, objects, components, scripts, Web pages, or others, that perform particular tasks or implement particular abstract data types. Moreover, those skilled in the art will understand that some embodiments may be practiced with other computer system configurations, including hand-held devices, multiprocessor-based, microprocessor-based or programmable consumer electronics, network PCs, minicomputers, mainframe computers, and the like. Some embodiments may also be practiced in distributed computing environments where tasks are performed by remote processing devices linked through a communication network. In a distributed computing environment, program modules may be located in both local and remote memory storage devices based on various remote access architecture such as DCOM, CORBA, Web objects, Web Services or other similar architectures. The storage device 13 may be a hard drive, magnetic drive, optical drive, portable drive, or nonvolatile memory drive. The drives and associated computer-readable media thereof (if required) provide nonvolatile storage of computer-readable instructions, data structures and program modules. The processing unit 11, controlled by program modules received from the memory 12 and from an operator through the input device, directs etching operation management functions.

The etching tool 220 performs dry (e.g., plasma) or wet etching operations on wafers according to a predefined procedure (i.e., a predetermined set of steps or "recipe"). For example, in a plasma chamber, substrate etching is achieved by exposing a substrate to ionized gas compounds (plasma) under vacuum. The etching process begins when the gases are conveyed into plasma chamber. The Radio Frequency (RF) ionizes the gases tuned by a particular recipe to control the direction and energy of ion bombardment of a wafer. During the etching process, the plasma reacts chemically with the surface of a wafer to remove material not covered by a photoresist mask. The etching tool 220 preferably provides software services compliant to the semiconductor equipment and material international (SEMI) standard specifying transport protocol, message format and functionality. When a wafer process is initiated, an event with requisite SEMI standard information is sent to the process controller 210.

Figure 4:
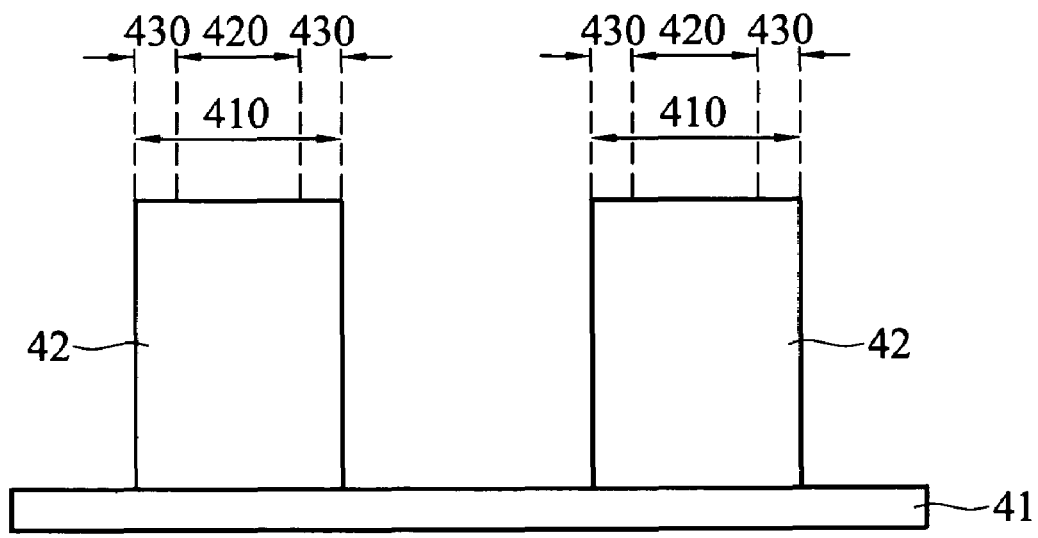
FIGS. 4 and 5 are schematic cross-sectional diagrams illustrating the etching process results.
Figure 5:
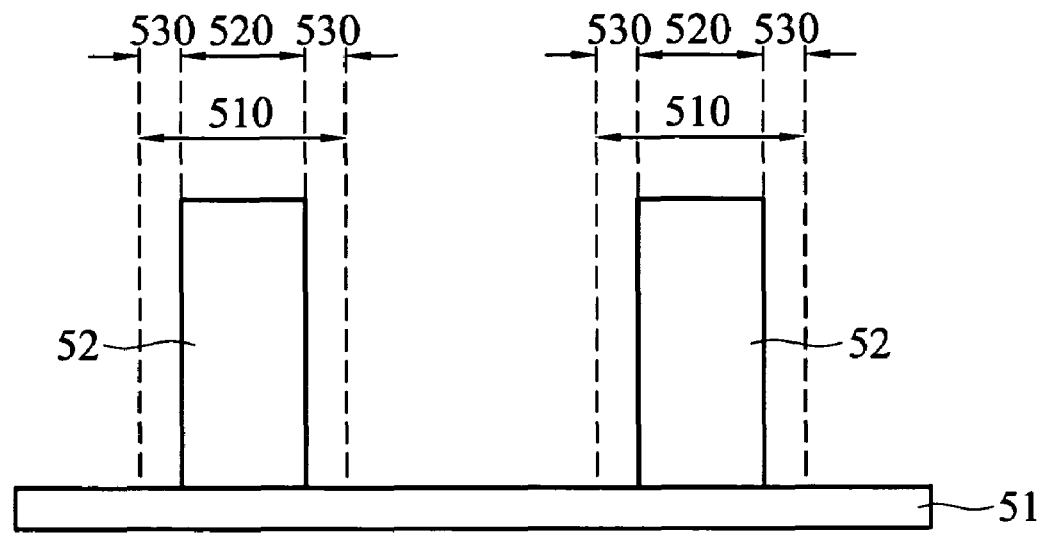

One or more wafers processed by the etching tool 220 are sent to the metrology tool 230 to acquire metrology data. The metrology data corresponds to a variety of physical or electrical characteristics of the devices formed on wafers. For example, metrology data comprising line widths, depth of trenches, sidewall angles, thickness, resistance, and the like may be obtained. The metrology data may be stored in the database unit 240 and used to further determine CD bias present on a wafer. FIGS. 4 and 5 are schematic cross-sections illustrating the results of etching process. Referring to FIG. 4, the metal line 42 on the semiconductor substrate 41 has a target width 420 corresponding to a CD. After a number of etching operations, however, the width of the metal layer 410 measured by the metrology tool 230 may exceed the target width 420. Such CD bias 430 can be adjusted by increasing etching duration for the next wafer. Referring to FIG. 5, the metal line 52 on the semiconductor substrate 51 has a target width 520, corresponding to a CD. After a number of etching operations, however, the width of the metal layer 510 measured by the metrology tool 230 may be lower than target width 520. Such CD bias 530 can be adjusted by decreasing etching duration for the next wafer.

Figure 1:
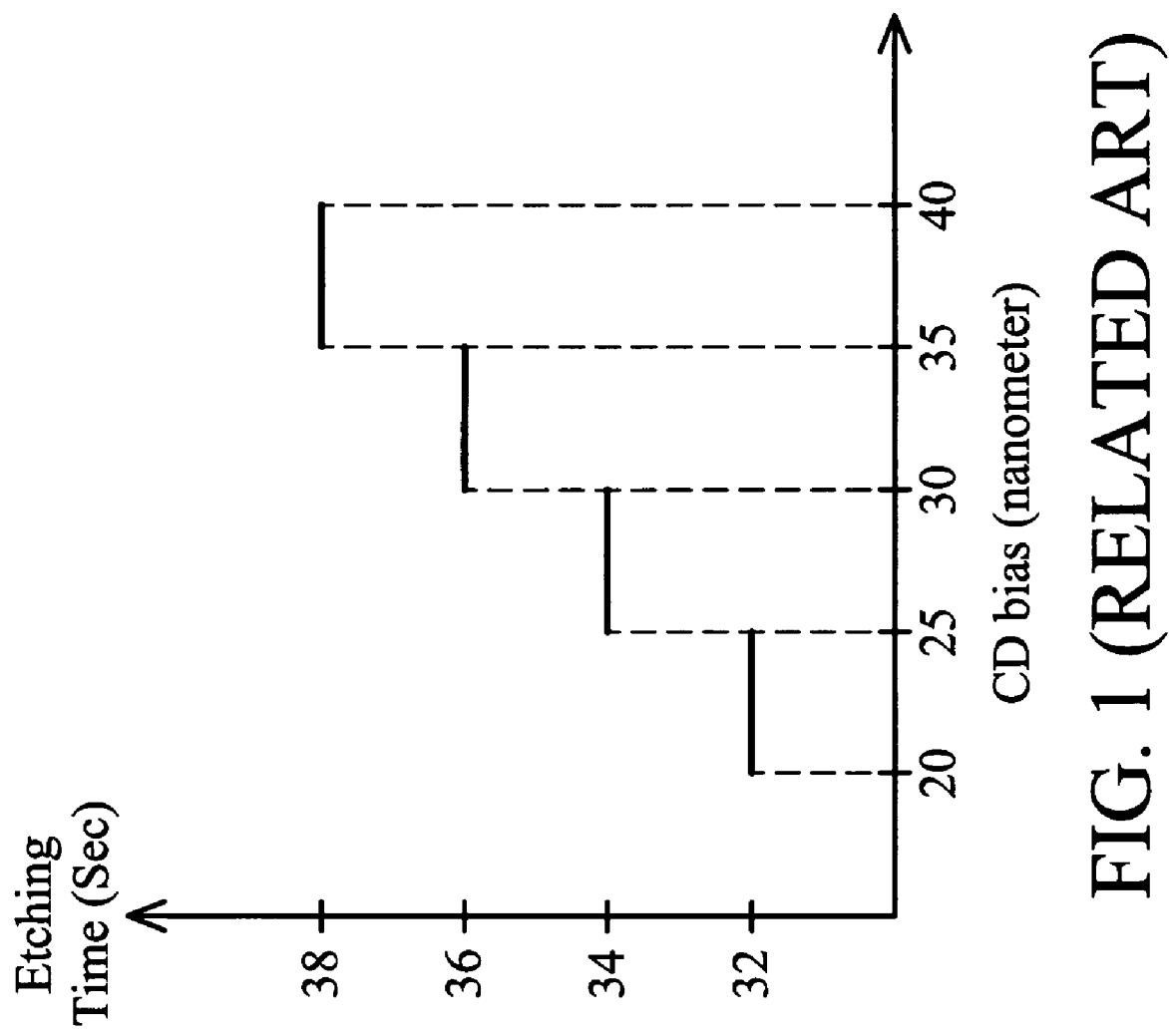
FIG. 1 is a schematic diagram showing the conventional etching duration adjustment.
Figure 6:
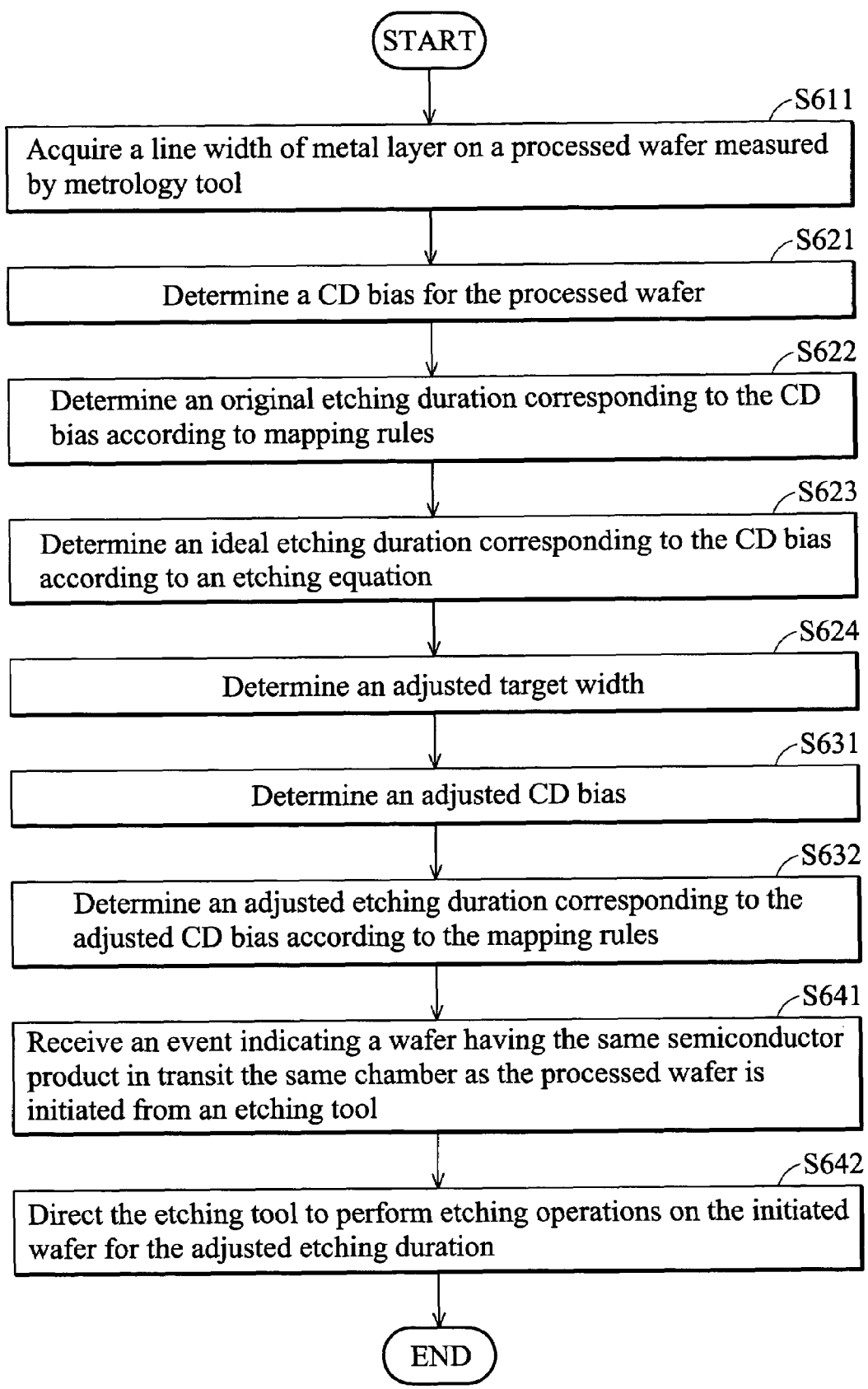
FIG. 6 is a flowchart showing an embodiment of a method of etching operation management.
Figure 7:
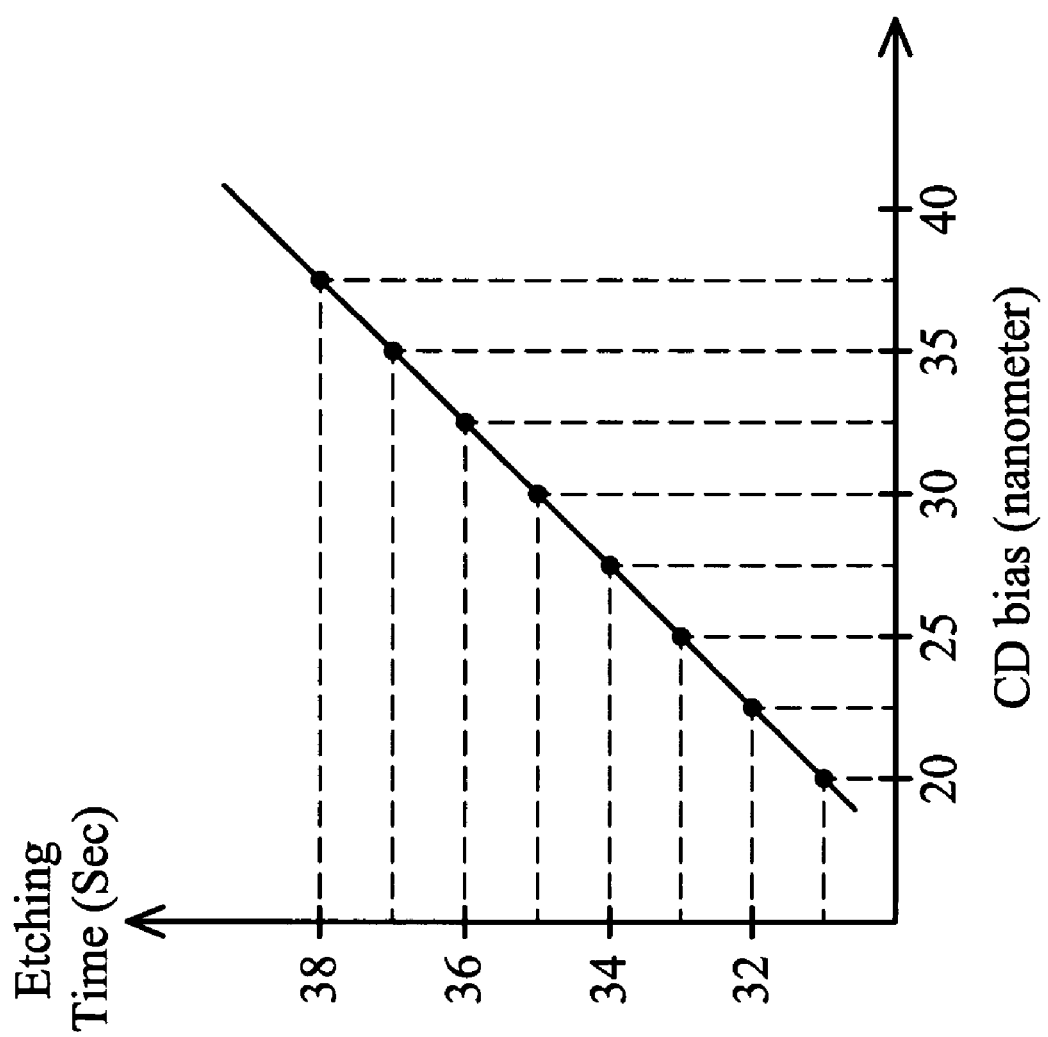
FIG. 7 is a schematic diagram showing the etching duration versus CD bias for an exemplary etching equation.

An embodiment of an etching operation management method directs the etching tool 220 to perform etching operations on a wafer having the same semiconductor product, in transit the same chamber as a processed wafer for adjusted etching duration, employed by the process controller 210. FIG. 6 is a flowchart of an embodiment of a method of etching operation management. In step S611, a line width on one or more processed wafers, preferably measured by the metrology tool 230, is acquired, preferably from database unit 240. In step S621, a CD bias for the processed wafer is determined by subtracting a predetermined target width (i.e. CD) from the measured width. In step S622, an original etching duration corresponding to the CD bias is determined, preferably according to predetermined mapping rules. The predetermined mapping rules, for example, illustrated in FIG. 1, use given time increments to determine an etching duration for a CD bias. Such mapping rules may be expressed as meta-rules (rule templates), as the maximum or minimum number of predicates that can occur in the rule antecedent or consequent, as relationships between etching duration and CD bias values, as equations comprising CD bias attributes, and/or aggregates. In step S623, an ideal etching duration corresponding to the determined CD bias is determined, preferably according to an etching equation. The etching equation is employed to calculate optimum etching duration corresponding to a CD bias. FIG. 7 is a schematic diagram showing the etching duration versus CD bias for an exemplary etching equation. The formula as shown in FIG. 7 is shown in equation (1).

$$Y=24+0.4*X, \quad \text{Equation (1):}$$

where Y represents the etching duration, X represents the CD bias, 24 represents the intercept (seconds of Y when CD bias is zero), and 0.4 represents the slope (the change in Y per one nanometer change in X). The slope also represents an etching rate for etching operations. In step S624, an adjusted target width is determined based on the target width, etching rate (i.e. the slope in the etching equation), original etching duration and ideal etching duration. Equation (2) shows a formula for calculating an adjusted target width.

$$W_{at}=W_t-R*(T_i-T_o), \quad \text{Equation (2):}$$

where $W_{at}$ represents the adjusted target width, $W_t$ represents the predetermined target width, R represents the etching rate, $T_i$ represents the ideal etching duration, and $T_o$ represents the original etching duration.

In step S631, an adjusted CD bias is determined corresponding to the line width on the processed wafer/wafers, preferably measured by the metrology tool 230, a compensating width for the semiconductor product on the processed wafer, a compensating width for the destination chamber of the processed wafer, and the adjusted target width. Equation (3) shows a formula for calculation of an adjusted CD bias.

$$CD_b=W_p+W_c+W_m-W_{at}, \quad \text{Equation (3):}$$

where $CD_b$ represents the adjusted CD bias, Wp represents the compensating width for the semiconductor product on the processed wafer, $W_c$ represents the compensating width for the destination chamber of the processed wafer, $W_m$ represents the measured width, and $W_{at}$ represents the adjusted target width. Note that $W_p$ and $W_t$ are calculated using well-known equations, algorithms or models, and are only described briefly herein. In step S632, adjusted etching duration for the next wafer having the same semiconductor product in transit to the same chamber as the processed wafer, is determined according to the predetermined mapping rules.

In step S641, an event indicating that a wafer having the same semiconductor product and going to the same chamber as the processed wafer is initiated from the etching tool 220. In step S642, the etching tool 220 is directed to perform etching operations on the initiated wafer for the adjusted etching duration. Fabrication of at least one semiconductor device in the wafer lot utilizes the embodiment of method.

Figure 8:
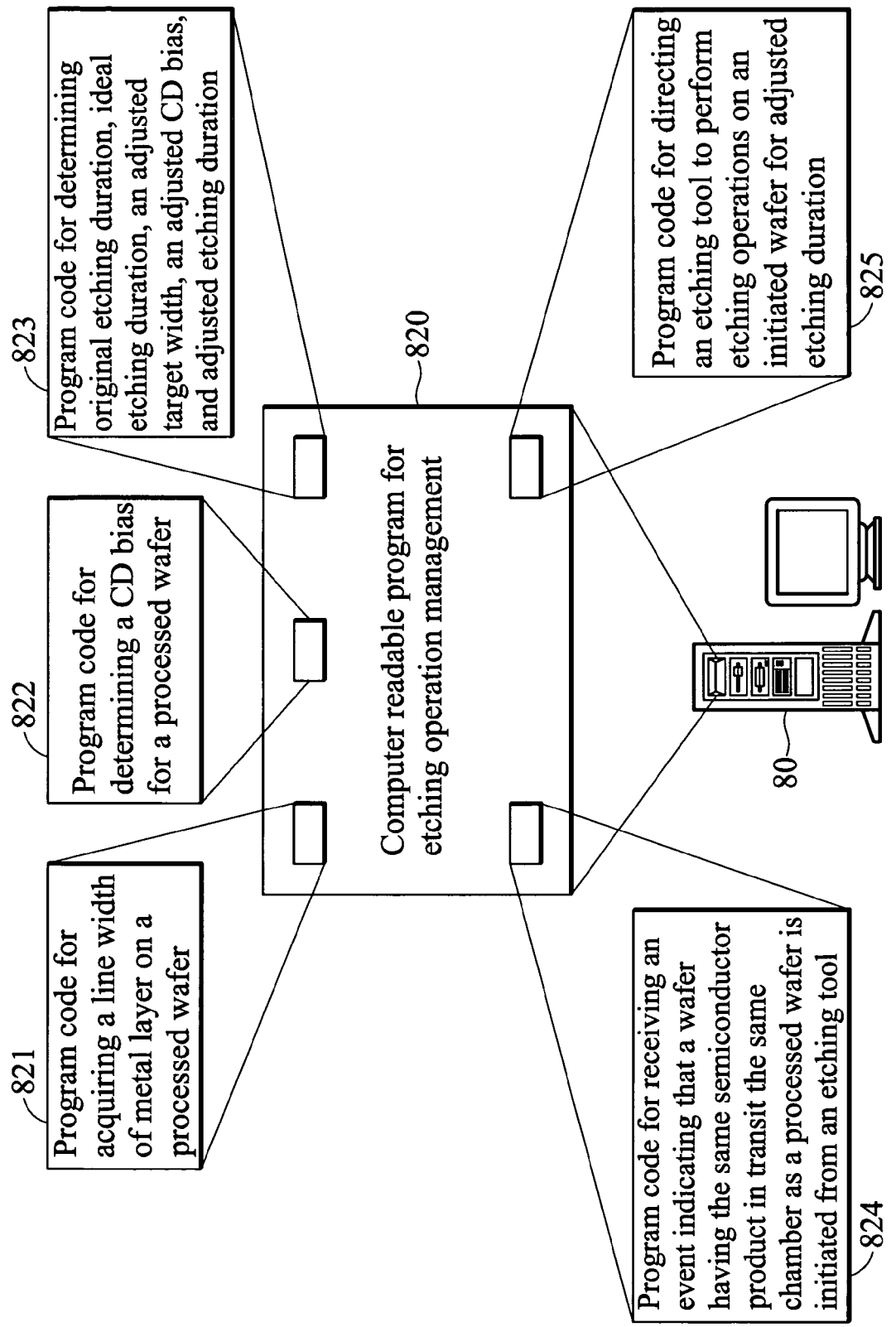
FIG. 8 is a diagram of a storage medium storing a computer program providing an embodiment of a method of etching operation management.

Also disclosed is a storage medium as shown in FIG. 8 storing a computer program 820 providing the disclosed method of etching operation management to adjust etching duration for a wafer having the same semiconductor product and going to the same chamber as a processed wafer. The computer program product includes a storage medium 80 having computer readable program code therein. The computer readable program code comprises at least computer readable program code 821 acquiring a line width on a processed wafer measured by a metrology tool, computer readable program code 822 determining a CD bias for a processed wafer, computer readable program code 823 determining original etching duration, ideal etching duration, an adjusted target width, an adjusted CD bias, and adjusted etching duration, computer readable program code 824 receiving an event indicating that a wafer having the same semiconductor product, in transit the same chamber as a processed wafer is initiated from an etching tool, and computer readable program code 825 directing an etching tool to perform etching operations on an initiated for adjusted etching duration.

Etching operation management systems and methods, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The disclosed methods and systems may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing an embodiment of the invention. When implemented on a general-purpose processor, the program code combines with the processor to provide a unique apparatus that operates analogously to specific logic circuits.

While the invention has been described in terms of preferred embodiment, it is not intended to limit the invention thereto. Those skilled in this technology can make various alterations and modifications without departing from the scope and spirit of the invention. Therefore, the scope of the invention shall be defined and protected by the following claims and their equivalents.

What is claimed is:

1. A system for etching operation management, comprising:
   a metrology tool;
   an etching tool; and
   a process controller coupling to the etching tool and the metrology tool, acquiring a line width on a processed wafer measured by the metrology tool, determining a first Critical Dimension (CD) bias by subtracting the measured line width from a target width, determining a first etching duration, determining a second etching duration, determining an adjusted target width based on the first and second etching durations, calculating a second CD bias according at least to the adjusted target width, determining a third etching duration corresponding to the second CD bias, and directing the etching tool to perform an etching operation on another wafer for the third etching duration,
   wherein the adjusted target width is calculated by an equation:

$$W_{at}=W_t-R*(T_i-T_o),$$

where $W_{at}$ represents the adjusted target width, $W_t$ represents the target width, R represents an etching rate, $T_i$ represents the second etching duration, and $T_o$ represents the first etching duration.

2. The system of claim 1 wherein the process controller determines the first etching duration and the third etching duration by at least one mapping rule, the rule using a given time increment to determine the first etching duration corresponding to the first CD bias and to determine the third etching duration corresponding to the second CD bias.

3. The system of claim 1 wherein the etching rate represents the change in etching duration per one nanometer change in CD bias.

4. The system of claim 1 wherein the second CD bias is calculated by an equation, $$CD_b=W_p+W_c+W_m-W_{at},$$

wherein $CD_b$ represents the second CD bias, Wp represents the compensating width for the semiconductor product on the processed wafer, $W_c$ represents the compensating width for the chamber that the processed wafer was transited, $W_m$ represents the measured width, and $W_{at}$ represents the adjusted target width.

5. The system of claim 1 wherein the line width on the processed wafer is measured using an electron beam (e-beam).

6. The system of claim 1 wherein the process controller receives an event indicating that said another wafer is ready for an etching operation, the event being compatible with the semiconductor equipment and material international (SEMI) standard.

7. The system of claim 1 further comprising a database unit storing the line width on the processed wafer.

8. The system of claim 7 wherein the process controller acquires the line width on the processed wafer from the database unit.

9. A method of etching operation management, comprising the steps of:
    acquiring a line width on a processed wafer;
    determining a first Critical Dimension (CD) bias by subtracting the line width from a target width;
    determining a first etching duration corresponding to the first CD bias according to at least one mapping rule;
    determining a second etching duration corresponding to the first CD bias according to an etching equation;
    determining an adjusted target width based on the first and second etching durations;
    calculating a second CD bias according at least to the adjusted target width; and
    determining a third etching duration corresponding to the second CD bias according to the mapping rule,
    wherein the adjusted target width is calculated by an equation:

$$W_{at}=W_t-R*(T_i-T_o),$$

where $W_{at}$ represents the adjusted target width, W represents the target width, R represents an etching rate, $T_i$ represents the second etching duration, and $T_o$ represents the first etching duration.

10. The method of claim 9, further comprising the step of:
    performing an etching operation on another wafer for the third etching duration.

11. The method of claim 9 wherein the mapping rule uses a given time increment to determine the first etching duration corresponding to the first CD bias and to determine the third etching duration corresponding to the second CD bias, and the second etching duration is the optimum etching duration corresponding to the first CD bias.

12. The method of claim 9 wherein the etching rate represents the change in etching duration per one nanometer change in CD bias.

13. The method of claim 9 wherein the second CD bias is calculated by an equation, $$CD_b=W_p+W_c+W_m-W_{at},$$

wherein $CD_b$ represents the second CD bias, Wp represents the compensating width for the semiconductor product on the processed wafer, $W_c$ represents the compensating width for the chamber that the processed wafer was transited, $W_m$ represents the measured width, and $W_{at}$ represents the adjusted target width.

14. The method of claim 9 wherein the line width on the processed wafer is measured using an electron beam (e-beam).

15. The method of claim 9 wherein the line width on the processed wafer is acquired from a database unit or a metrology tool.

16. An electronic device on which an etching operation has been performed for a given duration determined by a method comprising:
    acquiring a line width on a processed wafer;
    determining a first Critical Dimension (CD) bias by subtracting the line width from a target width;
    determining a first etching duration corresponding to the first CD bias according to at least one mapping rule;
    determining a second etching duration corresponding to the first CD bias according to an etching equation;
    determining an adjusted target width based on the first and second etching durations;
    calculating a second CD bias according at least to the adjusted target width; and
    determining a third etching duration corresponding to the second CD bias according to the mapping rule,
    wherein the adjusted target width is calculated by an equation:

$$W_{at}=W_t-R*(T_i-T_o),$$

where $W_{at}$ represents the adjusted target width, $W_t$ represents the target width, R represents an etching rate, $T_i$ represents the second etching duration, and $T_o$ represents the first etching duration.

17. The electronic device as claimed of claim 16 wherein the mapping rule uses a given time increment to determine the first etching duration corresponding to the first CD bias and to determine the given etching duration corresponding to the second CD bias.

* * * * *